United States Patent [19]
Sandner

[11] Patent Number: 6,075,392
[45] Date of Patent: Jun. 13, 2000

[54] CIRCUIT FOR THE GLITCH-FREE CHANGEOVER OF DIGITAL SIGNALS

[75] Inventor: Christoph Sandner, Villach, Austria

[73] Assignee: Siemens Aktiengesellschaft, Munich, Germany

[21] Appl. No.: 09/130,138

[22] Filed: Aug. 6, 1998

[30] Foreign Application Priority Data

Aug. 6, 1997 [DE] Germany .......................... 197 34 028

[51] Int. Cl.[7] .................................................. H03L 7/00
[52] U.S. Cl. ............................ 327/145; 327/99; 327/298
[58] Field of Search .................................. 327/292, 296, 327/298, 144, 145, 152, 99

[56] References Cited

U.S. PATENT DOCUMENTS

| | | | |
|---|---|---|---|
| 4,707,842 | 11/1987 | Fischer ..................................... | 375/110 |
| 4,855,616 | 8/1989 | Wang et al. ............................... | 327/99 |
| 5,574,393 | 11/1996 | Nguyen et al. .......................... | 327/142 |
| 5,652,536 | 7/1997 | Nookala et al. ......................... | 327/298 |

OTHER PUBLICATIONS

"Introduction to VLSI Systems" (Mead), Oct. 1980, pp. 232–262, Addison—Wesley Series in Computer Science.

"The Art of Electronics" (Horowitz), Cambridge University Press, 1989, pp. 515–516.

*Primary Examiner*—Jung Ho Kim
*Attorney, Agent, or Firm*—Herbert L. Lerner; Laurence A. Greenberg; Werner H. Stemer

[57] ABSTRACT

A circuit for the glitch-free changeover between digital signals includes a multiplexer having a multiplicity of signal input terminals, signal select terminals and a signal output terminal. Furthermore, the circuit includes a counter logic unit for counting pulses in the output signal of the multiplexer and for outputting a count signal when a specific count value is reached. A delay logic unit delays a multiplexer select signal and outputs a switching signal and a delayed multiplexer select signal. During a set switching signal the counter logic unit is activated and the circuit output is deactivated.

6 Claims, 3 Drawing Sheets

6,075,392

CIRCUIT FOR THE GLITCH-FREE CHANGEOVER OF DIGITAL SIGNALS

BACKGROUND OF THE INVENTION

Field of the Invention

The invention relates to a circuit for the glitch-free changeover of digital signals with a multiplexer that has a multiplicity of signal input terminals, signal select terminals, and a signal output terminal, and with a terminal for the circuit output.

In frequency synthesizers of microcontrollers having internal clock signal generation by means of PLL (phase-locked loop), there is often the need to enable an output clock signal of the circuit to be changed over between a plurality of frequencies. For this purpose, a multiplexer is usually used in the circuit. Different clock signals are thereby applied to different inputs of the multiplexer. At the multiplexer, it is possible to select which of the input signals is passed to the output. For this purpose, the multiplexer has corresponding signal select terminals. In many cases, it must be ensured that in the event of a changeover from a first input signal to a second input signal of the multiplexer—in the event of a changeover from a first clock rate to a second clock rate—no clock period occurs which is shorter than the minimum permissible clock period. Such an impermissible clock period is referred to in the art as a "glitch". Such a short pulse can lead to an uncontrolled malfunction of the downstream circuit which is driven by the output clock signal of the multiplexer. This is the case, in particular, when the clock signal is the system clock signal of a microcontroller.

The formation of glitches and their undesirable consequences are explained for example in the textbook by Paul Horowitz entitled "The Art of Electronics", 2nd Ed. 1989, Cambridge University Press, pp. 515ff. Horowitz describes (Ch. 8.19) synchronizers with which the problems caused by glitches can largely be avoided. The textbook by Carver A. Mead entitled "Introduction to VLSI Systems", Addison-Wesley, 1980, likewise discusses the subject of a lack of synchronization and its consequences in Chapter 7.5 thereof, entitled "Synchronisation Failure", pp. 236–242. The foregoing publications are incorporated by reference particularly with regard to the explanation of the term "glitches".

SUMMARY OF THE INVENTION

It is accordingly an object of the invention to provide a circuit for the glitch-free changeover of digital signals, which overcomes the above-mentioned disadvantages of the heretofore-known devices and methods of this general type and which makes it possible to change over between a multiplicity of digital signals without any glitches.

With the foregoing and other objects in view there is provided, in accordance with the invention, a circuit for the glitch-free changeover of digital signals, comprising:

a multiplexer having a multiplicity of signal input terminals, signal select terminals, and a signal output terminal;

a circuit output connected to the multiplexer for outputting a circuit output signal;

a counter logic unit connected to the multiplexer for counting pulses in an output signal of the multiplexer and for outputting a count signal when a specific count value has been reached;

a delay logic unit connected to the multiplexer for delaying a multiplexer select signal and for outputting a switching signal and a delayed multiplexer select signal; and wherein the counter logic unit is activated and the circuit output is deactivated during a set switching signal.

In accordance with an added feature of the invention, the switching signal is set after a change in the multiplexer select signal and is reset after the count value has been reached.

In other words, a digital signal can be applied to each of the signal input terminals of the multiplexer. The digital signals are preferably clock signals having mutually different clock rates. The multiplexer furthermore has signal select terminals to which it is possible to apply digital signals which define which of the multiplicity of input signals is selected in order to be output by the multiplexer. Accordingly, the multiplexer has a signal output terminal at which the selected signal is output. The circuit is characterized inter alia by a counter logic unit, which counts the pulses contained in the output signal of the multiplexer and outputs a count signal when a specific count value is reached. The pulses are preferably counted using the rising signal edge. The circuit is furthermore characterized by a delay logic unit, which delays an incoming select signal for the multiplexer and outputs a switching signal and a delayed select signal for the multiplexer. The counter logic unit is activated and the circuit output downstream of the output terminal of the multiplexer is deactivated during a set switching signal.

In this case, the switching signal is set on account of a change in the multiplexer select signal. After the setting of the switching signal, the counter logic unit commences counting operation and after a specific count value has been reached, the counter logic unit outputs a count signal. The delay logic unit is thereupon induced to reset the switching signal, which, in the course of setting, finally applies the change in the multiplexer select signal, the change having been applied previously to the circuit, with a delayed action directly to the multiplexer.

In accordance with an additional feature of the invention, the delay logic unit includes a plurality of series-connected, edge-triggered D-type flip-flops each having a D terminal and a Q terminal, and each being clocked by the output signal of the multiplexer, and wherein a signal indicating that the multiplexer select signal has just changed is applied to the D terminal of a first of the flip-flops, and the switching signal is output at the Q terminal of an $n^{th}$ of the flip-flops.

The effect achieved by the delay circuit is that a change in the selection of one of the signal input terminals is applied with a delay to the multiplexer. In accordance with another feature of the invention, therefore, the delay logic unit has exactly two D-type flip-flops.

In accordance with a further feature of the invention, the counter logic unit has a single-bit counter.

In accordance with a concomitant feature of the invention, the counter logic unit has a D-type flip-flop clocked by pulses in the output signal of the multiplexer and delays an output signal of the single-bit counter.

In a single-bit counter, the count value is reached as early as after one clock period, whereupon it outputs the count signal. In this case, it is particularly preferred for the counter logic unit to have a D-type flip-flop which delays the output signal of the single-bit counter by an additional clock period. This ensures that a metastable state possibly occurring in the single-bit counter cannot lead to premature outputting of the count signal.

Other features which are considered as characteristic for the invention are set forth in the appended claims.

Although the invention is illustrated and described herein as embodied in a circuit for glitch-free changeover of digital signals, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
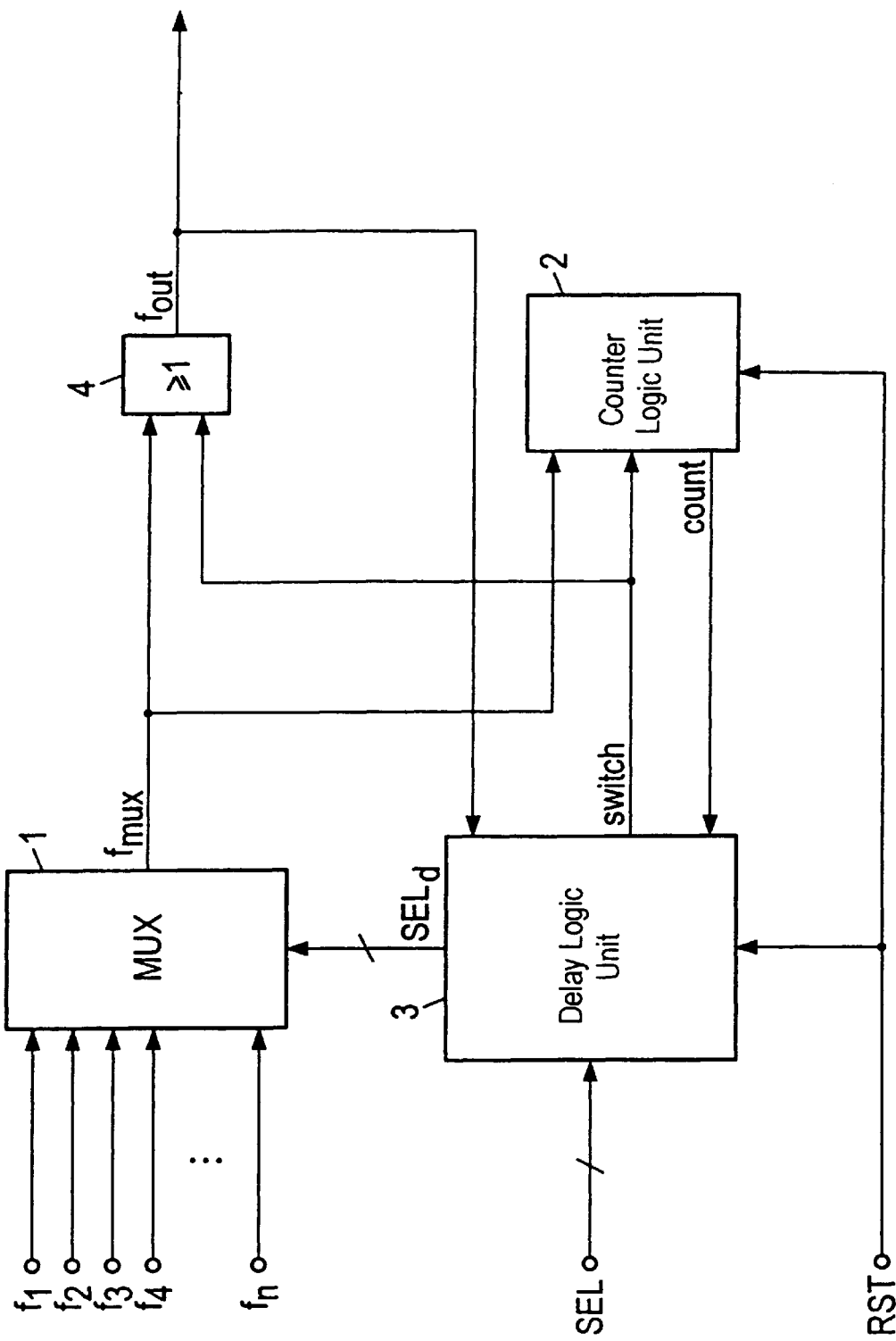
FIG. 1 is a circuit block diagram of a preferred exemplary embodiment of the invention.

Referring now to the figures of the drawing in detail and first, particularly, to FIG. 1 thereof, there is seen a multiplexer 1, a counter logic unit 2 and a delay logic unit 3. A multiplicity of signals $f_1, f_2, f_i, \ldots f_n$, which are typically clock signals having different clock rates, are fed to the multiplexer 1. The multiplexer 1 has a single output terminal, at which it is possible to pick off a signal $f_{mux}$, which is selected from the multiplicity of input signals $f_1$, $f_2, \ldots f_n$. Selection is effected by a signal $SEL_d$, which is fed to the multiplexer from the delay logic unit 3. The multiplexer select signal $SEL_d$ is typically a digital signal which is split between a plurality of physical lines which are designated in combination as a bus that is indicated in FIG. 1 by an oblique mark on the line carrying the signal $SEL_d$.

The output signal $f_{mux}$ of the multiplexer 1 is fed as a clock signal to the counter logic unit 2. Furthermore, a switching signal switch, which enables the counter operation when it is set, is fed to the counter logic unit 2 from the delay logic unit 3. The counter logic unit 2 furthermore has an output terminal at which a counter signal count is output. This counter signal count shows that a specific count value has been reached. Finally, the counter logic unit 2 has an input terminal for the feeding of a reset signal RST, whereby the counter reading is reset to an initial state.

The delay logic unit 3 has input terminals for the feeding of select signals SEL. The signal SEL selects an input signal from the multiplicity of input signals $f_1, f_2, \ldots f_n$ of the multiplexer 1. Similarly to the delayed multiplexer select signal $SEL_d$, the multiplexer select signal SEL is represented by a digital signal bus in the preferred exemplary embodiment. The delay logic unit 3 receives the multiplexer select signal SEL and outputs it to the multiplexer 1 with a delay as the delayed multiplexer select signal $SEL_d$. After a change in the multiplexer select signal SEL, the delay logic unit 3 outputs the switching signal switch to the counter logic unit 2.

The switching signal switch is furthermore fed to an OR gate 4, which also receives the output signal $f_{mux}$ of the multiplexer. The output signal of the OR gate 4 $f_{out}$ corresponds to the output signal $f_{mux}$ of the multiplexer 1 when the switching signal switch is not set (low level) and corresponds to the switching signal switch when the latter is set (high level).

The delay logic unit 3 is clocked by the output signal $f_{out}$ of the OR gate 4, which is simultaneously the output signal of the circuit. The switching signal switch is reset when the delay logic unit 3 receives the count signal count from the counter logic unit 2 or when an external reset signal is received.

The circuit is based on the following sequence: the change in the multiplexer select signal SEL is registered and signaled to the counter logic unit 2 and to the OR gate 4 by setting of the switching signal switch after a specific number of clock periods of the output signal $f_{out}$ have elapsed. As a result of the setting of the switching signal switch, the output signal $f_{mux}$ of the multiplexer 1, which has been passed through the OR gate 4 as output signal $f_{out}$ of the circuit prior to this point in time, is masked, with the result that the output signal $f_{out}$ of the circuit remains at a high level and thus no further clock signals are fed to the delay logic unit 3. As a result of the setting of the switching signal switch, the counter logic unit 2 is activated, whereby it is clocked by the output signal $f_{mux}$ of the multiplexer 1. At the same time, the setting of the switching signal switch causes the changed multiplexer select signal SEL to be passed through to the multiplexer 1 as delayed multiplexer select signal $SEL_d$ and, consequently, the multiplexer to change its output signal $f_{mux}$ in accordance with the currently selected input signal $f_i$. Since the delayed multiplexer select signal $SEL_d$ changes asynchronously with the input signals $f_1, f_2, \ldots, f_n$ of the multiplexer 1, undefined signal states which might be interpreted as multiple clocksignal edges in a downstream circuit and thus cause errors may occur at the output of the multiplexer 1 at the changeover instant. However, since the switching signal switch is already set at the changeover instant, these spurious signals, referred to as glitches, cannot appear in the output signal $f_{out}$ of the circuit since the output signal $f_{mux}$ of the multiplexer 1 is masked by the OR gate 4 by the switching signal switch.

The counter logic unit 2, which commences the counting operation once the switching signal switch is set, now counts the output signal $f_{mux}$ output by the multiplexer 1. The output signal $f_{mux}$ may contain the above-mentioned glitches in this period of time. After a specific counter value has been reached, which is dimensioned such that the output signal $f_{mux}$ of the multiplexer 1 has stabilized without any glitches at this point in time, the counter logic unit 2 outputs the count signal count, whereby the delay logic unit 3 is reset and the switching signal consequently falls again. Since the counter logic unit 2 is clocked by the output signal $f_{mux}$, it is ensured that when the switching signal switch is reset and thus the masking by the OR gate 4 is removed, glitches do not occur any longer in the output signal $f_{out}$ of the circuit.

Figure 2:
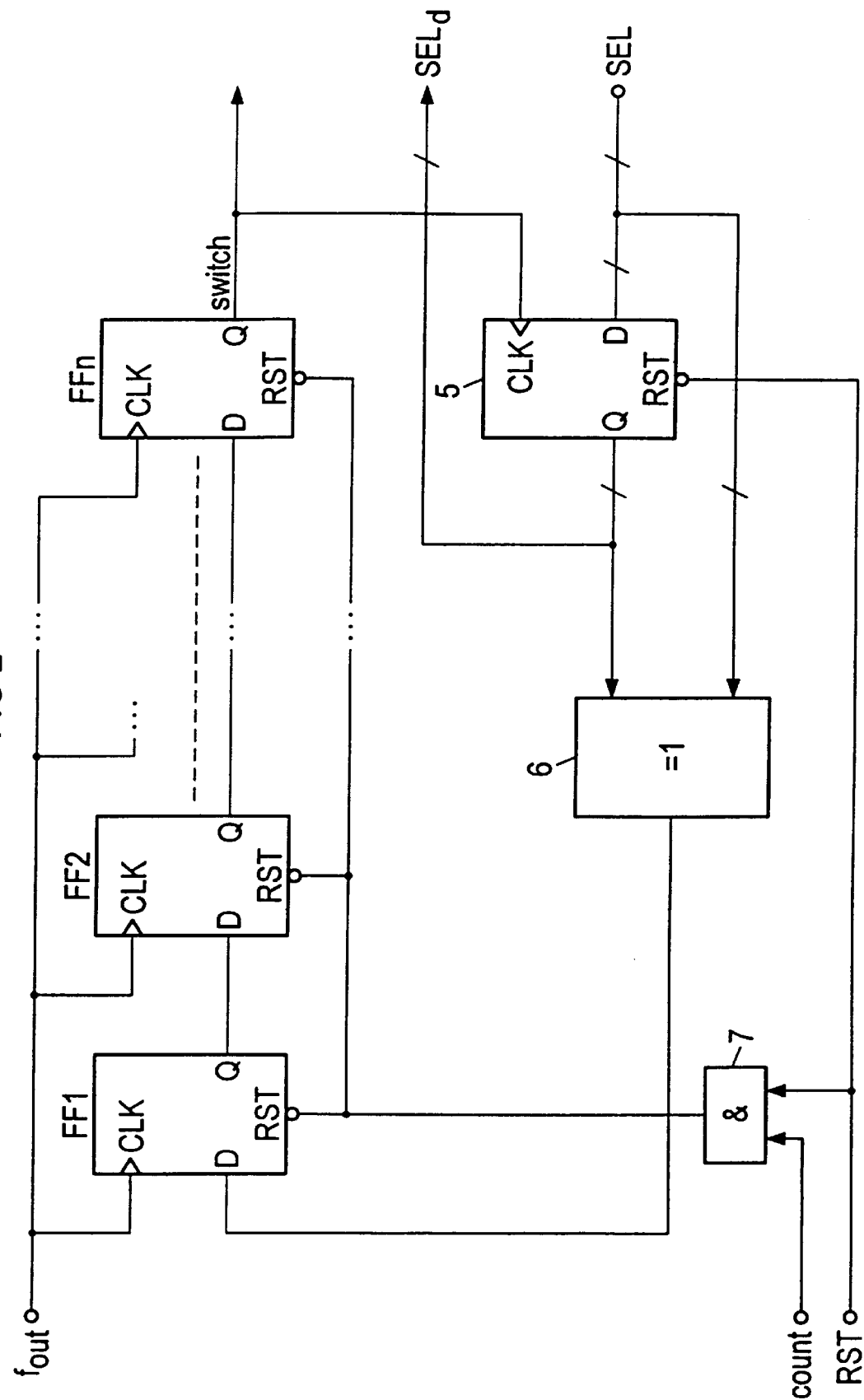
FIG. 2 is a block diagram of an exemplary embodiment of the delay logic unit.

FIG. 2 shows the configuration of the delay logic unit 3 in accordance with a preferred exemplary embodiment. Accordingly, the delay logic unit 3 has a series circuit formed by a multiplicity of edge-triggered D-type flip-flops FF1, FF2, ..., FFn, which are referred to below only as flip-flops. The flip-flops FF1, FF2, ..., FFn are all clocked by the output signal $f_{out}$ of the circuit. The flip-flops FF1, FF2, ..., FFn are connected in series such that the Q output of one flip-flop is connected to the D input of the next flip-flop in the series circuit. The switching signal switch is present at the Q output of the last flip-flop FFn.

The delay logic unit 3 has a further D-type flip-flop 5, which is clocked by the switching signal switch. The flip-flop 5 actually comprises a parallel circuit of m flip-flops corresponding to the number of lines on the bus for the multiplexer select signal SEL. For the purpose of simplification, however, in the rest of the text the reference symbol 5 refers to only one flip-flop, which is representative of all m flip-flops that are necessary for the respective number of bus lines. The delayed multiplexer select signal $SEL_d$ can be picked off at the Q output of the flip-flop 5. Furthermore, the output signal of the flip-flop 5 is fed to a combined EXOR gate 6 with two times m input terminals. The remaining m input terminals of the EXOR gate are formed by the multiplexer select signal SEL. A signal that is set whenever there is a difference between the multiplexer select signal SEL and the delayed multiplexer select signal $SEL_d$ on any bus line is present at the output terminal of the EXOR gate 6. Since the multiplexer select signal SEL and the delayed multiplexer select signal SEL,L are identical in the steady state, a change in the multiplexer select signal SEL is indicated by a set output signal at the EXOR gate 6.

The output terminal of the EXOR gate 6 is connected to the D terminal of the first flip-flop FF1 of the series circuit of flip-flops FF1, FF2, . . . , FFn. Consequently, a change in the multiplexer select signal SEL is indicated by setting the switching signal switch after n clock periods of the output signal $F_{out}$ of the circuit.

The series circuit of flip-flops FF1, FF2, . . . , FFn is reset by the setting of the count signal count. The count signal count is at a low level in the set state. It is logically combined at an AND gate 7 with an external reset signal RST, which is likewise at a low level in the set state. The output signal of the AND gate 7 is connected to all the reset inputs of the series circuit of flip-flops FF1, FF2, . . . , FFn. The series circuit of flip-flops is thus reset when either the count signal count or the reset signal RST is set, whereby the switching signal switch is reset. Moreover, the external reset signal RST is connected to the reset input of the flip-flop 5.

Figure 3:
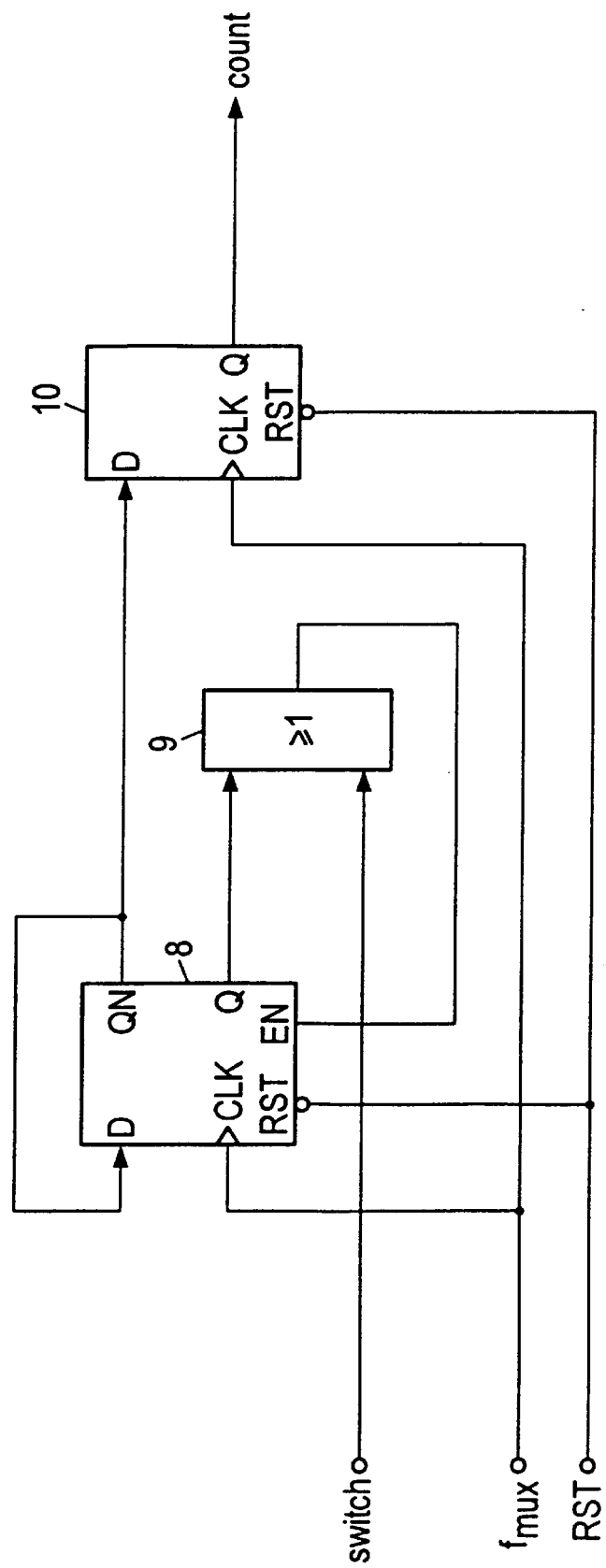
FIG. 3 is a block diagram of an exemplary embodiment of the counter logic unit.

FIG. 3 shows a preferred exemplary embodiment of the counter logic unit 2. In this case, a single-bit counter is provided which is formed by a D-type flip-flop 8. The D-type flip-flop 8 is clocked by the output signal $f_{mux}$ of the multiplexer 1. The inverted Q output terminal QN is connected to the input terminal D of the flip-flop 8, which leads to halving of the input clock frequency $f_{mux}$ at the output of the flip-flop 8. The flip-flop 8 furthermore has an enable terminal EN, to which the switching signal switch, which is at a high level in the set state, is passed via the OR gate 9. A further input terminal of the OR gate 9 is connected to the output terminal Q of the flip-flop 8, with the result that the flip-flop 8 can also switch when the switching signal switch is reset and the Q output terminal of the flip-flop 8 is currently at a high level.

The inverted output terminal QN of the flip-flop 8 is connected to the input terminal D of a flip-flop 10, which buffers the output signal of the counter by a further cycle of the clock signal $f_{mux}$. The count signal count is available at the output terminal Q of the flip-flop 10. Similarly to the flip-flops illustrated in FIG. 2, the flip-flop 8 and the flip-flop 10 can be reset by an external reset signal RST.

The problem of changing over between a multiplicity of clock signals has been solved to date only by the use of a multiplexer. In that case, however, a glitch-free changeover is possible only between synchronous signals and the changeover itself must likewise take place synchronously. If, for example, a switch is made from a first clock signal, which is currently at a low level, to a second clock signal, which is currently at a high level, then a rising edge which was present in none of the two clock signals is produced at the output of the multiplexer. Even if both clock signals are at a high level, glitches can occur during the changeover in certain multiplexer architectures. These are caused by static race hazards due to different delays in the select lines. A glitch-free changeover between asynchronous signals is not possible with a conventional multiplexer.

The circuit according to the invention uses a conventional digital multiplexer for the changeover and furthermore uses additional logic which ensures a glitch-free switching operation of both synchronous and asynchronous digital signals. The multiplexer select signals can also be switched asynchronously. Possibly occurring metastable states at the flip-flops on account of concurrence of asynchronous signals are latched by synchronizing flip-flops, such as, for instance, the series circuit formed by the multiplicity of flip-flops FF1, FF2, . . . , FFn and the flip-flop 10 of the counter logic unit 2, and thus do not propagate within the circuit. Moreover, the circuit can be reset by application of an asynchronous external reset signal RST.

I claim:

1. A circuit for the glitch-free changeover of digital signals, comprising:

a multiplexer having a multiplicity of signal input terminals, signal select terminals, and a signal output terminal;

a circuit output connected to said multiplexer for outputting a circuit output signal;

a counter logic unit connected to said multiplexer for counting pulses in an output signal of said multiplexer and for outputting a count signal when a specific count value has been reached;

a delay logic unit connected to said multiplexer for delaying a multiplexer select signal and for outputting a switching signal after a change of the multiplexer select signal and for outputting a delayed multiplexer select signal; and an OR gate connected to said multiplexer for masking the output signal with the switching signal, wherein said counter logic unit is activated during a set switching signal.

2. The circuit according to claim 1, wherein the switching signal is reset after the count value has been reached.

3. The circuit according to claim 1, wherein said delay logic unit includes a plurality of series-connected, edge-triggered D-type flip-flops each having a D terminal and a Q terminal, and each being clocked by the output signal of said multiplexer, and wherein a signal indicating that the multiplexer select signal has just changed is applied to said D terminal of a first of said flip-flops, and the switching signal is output at said Q terminal of last of said flip-flops.

4. The circuit according to claim 3, wherein said delay logic unit has two D-type flip-flops.

5. The circuit according to claim 1, wherein said counter logic unit has a single-bit counter.

6. The circuit according to claim 5, wherein said counter logic unit has a D-type flip-flop clocked by pulses in the output signal of said multiplexer and delays an output signal of said single-bit counter.

* * * * *